United States Patent [19]
Lin et al.

[11] Patent Number: 6,077,633
[45] Date of Patent: Jun. 20, 2000

[54] MASK AND METHOD OF FORMING A MASK FOR AVOIDING SIDE LOBE PROBLEMS IN FORMING CONTACT HOLES

[75] Inventors: Chia-Hui Lin, Hsin-Chu; San-De Tzu, Taipei, both of Taiwan

[73] Assignee: Taiwan Semiconductor Manufacturing Company, Hsin-Chu, Taiwan

[21] Appl. No.: 09/210,700

[22] Filed: Dec. 14, 1998

[51] Int. Cl.[7] ........................................ G03F 9/00
[52] U.S. Cl. ................................................ 430/5
[58] Field of Search .................. 430/5, 322, 323, 430/324

[56] References Cited

U.S. PATENT DOCUMENTS

| | | | |
|---|---|---|---|
| 5,288,569 | 2/1994 | Lin | 430/5 |
| 5,429,897 | 7/1995 | Yoshioka et al. | 430/5 |
| 5,474,865 | 12/1995 | Vasuder | 430/5 |
| 5,477,058 | 12/1995 | Sato | 250/548 |
| 5,527,645 | 6/1996 | Pati et al. | 430/5 |
| 5,700,602 | 12/1997 | Dao et al. | 430/5 |
| 5,716,738 | 2/1998 | Garza | 430/5 |
| 5,882,827 | 3/1999 | Nakao | 430/5 |

OTHER PUBLICATIONS

P. Rai–Chadhury, "Handbook of Microlithography, Micromachining and Microfabrication, vol. I: Microlithography", SPIE Press, 1997, p74–82.

*Primary Examiner*—S. Rosasco
*Attorney, Agent, or Firm*—George O. Saile; Stephen B. Ackerman; Larry J. Prescott

[57] ABSTRACT

A mask and method of forming a mask for forming a closely spaced array of contact holes and larger isolated holes in an integrated circuit wafer. The mask provides a binary mask section for the formation of the closely spaced array of contact holes where the depth of focus is not a problem thereby avoiding problems due to side lobe effect. The mask also provides a ring type attenuating phase shifting mask for the formation of isolated larger holes where improved depth of focus is required, thereby also avoiding the problems due to side lobe effect in this region.

18 Claims, 3 Drawing Sheets

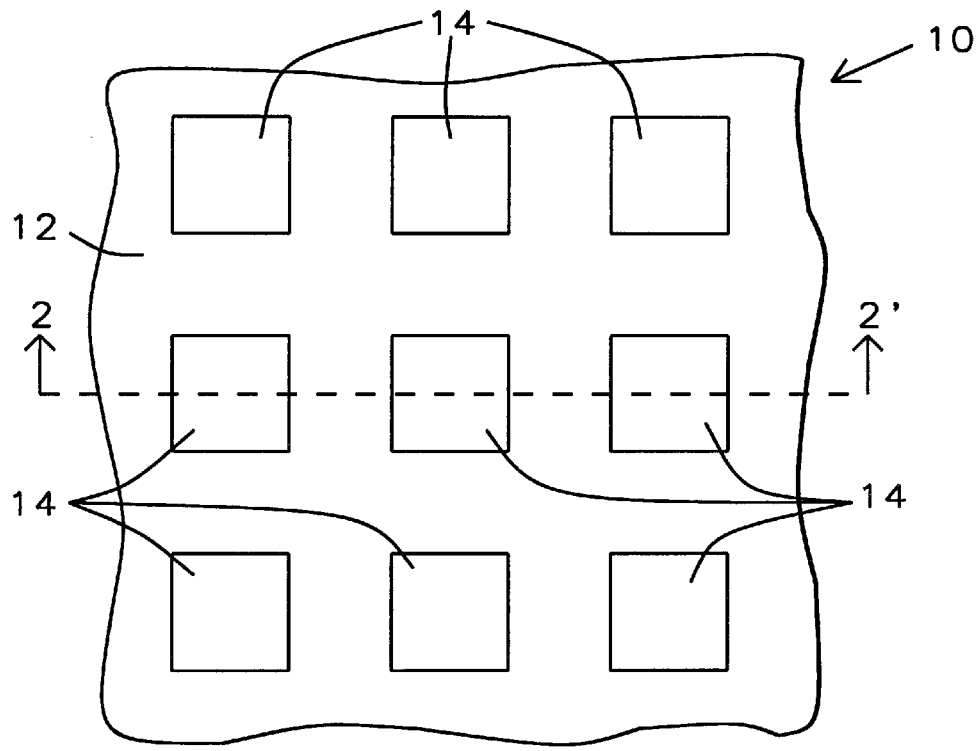
FIG. 1 – Prior Art
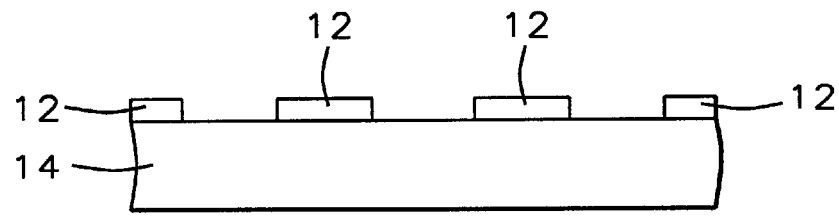
FIG. 2 – Prior Art

MASK AND METHOD OF FORMING A MASK FOR AVOIDING SIDE LOBE PROBLEMS IN FORMING CONTACT HOLES

BACKGROUND OF THE INVENTION (1) Field of the Invention

This invention relates to a mask and method of forming a mask for forming closely spaced and larger isolated contact holes in integrated circuit wafers. More specifically the invention relates to a combined binary and ring type attenuating phase shifting mask.

(2) Description of the Related Art

Attenuating phase shifting masks are frequently used to form contact holes in integrated circuit wafers. These masks often have problems due to side lobe effect due to the non zero light transmission of the attenuating phase shifting material.

The book "Handbook of Microlithography, Micromachining, and Microfabrication, Volume I: Microlithography, edited by P. Rai-Choudhury, SPIE Press, 1977, pages 74–82 discusses deferent types of phase shifting masks including attenuating phase shifting masks.

U.S. Pat. No. 5,700,602 to Dao et al. describes a method and apparatus for determining the actual phase shift for a reticle having a phase shifted feature.

U.S. Pat. No. 5,716,738 to Garza describes a mask using attenuating phase shifting material and a light opaque border. The light opaque border is preferably photosensitive polyimide.

U.S. Pat. No. 5,429,897 to Yoshioka et al. describes an attenuating phase shifting mask which has an attenuating type phase shifting pattern and an auxiliary attenuating type phase shifting pattern.

U.S. Pat. No. 5,288,569 to Lin describes feature biassing in phase shifting masks to improve the exposure latitude and depth of focus.

U.S. Pat. No. 5,474,865 to Vasudev describes a globally planarized binary optical mask having absorbers buried in the mask substrate.

U.S. Pat. No. 5,477,058 to Sato describes an attenuating phase shifting mask having a circuit pattern formed of attenuating phase shifting material. The reticle alignment marks are made of a separate substantially opaque layer.

U.S. Pat. No. 5,527,645 to Pati et al. describes a systematic method for producing phase shifting masks.

SUMMARY OF THE INVENTION

Contact holes in integrated circuit wafers frequently form a regular array of rows and columns of contact holes. The masks used to form these contact holes will have a regular array of rows and columns of contact hole patterns, see FIG. 1. These masks frequently use attenuating phase shifting material in the formation of the pattern used to form contact holes in order to provide improved depth of focus and image quality. FIG. 1 shows a top view of a part of a contact hole mask 10 formed using attenuating phase shifting material. FIG. 2 shows a cross section view of the part of the mask 10 of FIG. 1 taken along line 2–2' of FIG. 1. The contact hole mask 10 has a layer of attenuating phase shifting material 12 formed on a transparent mask substrate 14. Holes are formed in the attenuating phase shifting material 12 to form a contact hole mask in a layer of photoresist. The attenuating phase shifting material provides a 180° phase shift and partial transmission, usually between about 5% and 10%, for light having a wavelength of that used to illuminate the mask and expose the photoresist.

One of the problems encountered in using attenuating phase shifting masks in forming contact holes is side lobe effect, particularly as dimensions in integrated circuit wafers become smaller and with the increasing use of deep ultraviolet, DUV, light for the illumination of the masks. In side lobe effect the spaces between the contact holes become illuminated because of the non zero light transmission of the attenuating phase shifting material. This unwanted illumination results in unwanted developing of the photoresist and loss of image quality in the developed photoresist mask. These problems are increased when an array of closely spaced holes and isolated larger holes are formed using the same mask, see FIG. 3.

It is a principle objective of this invention to provide a mask for forming closely spaced contact holes and isolated larger contact holes which provides good depth of focus and avoids the problem of side lobe effect.

It is another principle objective of this invention to provide a method of forming a mask for forming closely spaced contact holes and isolated larger contact holes which provides good depth of focus and avoids the problem of side lobe effect.

These objectives are achieved by forming a binary type mask in the region of the mask used to form a closely spaced array of contact holes and a ring type attenuating phase shifting mask in the region of the mask used to form isolated larger contact holes. In the part of the mask used to form closely spaced holes the depth of focus is greater than the part of the mask used to form isolated holes so that the binary type mask can be used. In the part of the mask used to form isolated holes the ring type attenuating phase shifting mask provides good depth of focus and avoids side lobe effect.

The mask of this invention is formed by forming a layer of attenuating phase shifting material on a transparent mask substrate. A layer of opaque material is then formed on the layer of attenuating phase shifting material. Holes are selectively formed in the layer of attenuating material and the layer of opaque material thereby forming a binary type mask in the region of the mask having a closely spaced array of holes and a ring type attenuating phase shifting mask in the region of the mask used to form more widely spaced larger holes.

BRIEF DESCRIPTION OF THE DRAWINGS

FIG. 1 shows a top view of a conventional attenuating phase shifting mask used for an array of holes.

FIG. 2 shows a cross section view of the mask of FIG. 1 along line 2–2' of FIG. 1.

DESCRIPTION OF THE PREFERRED EMBODIMENTS

Figure 3:
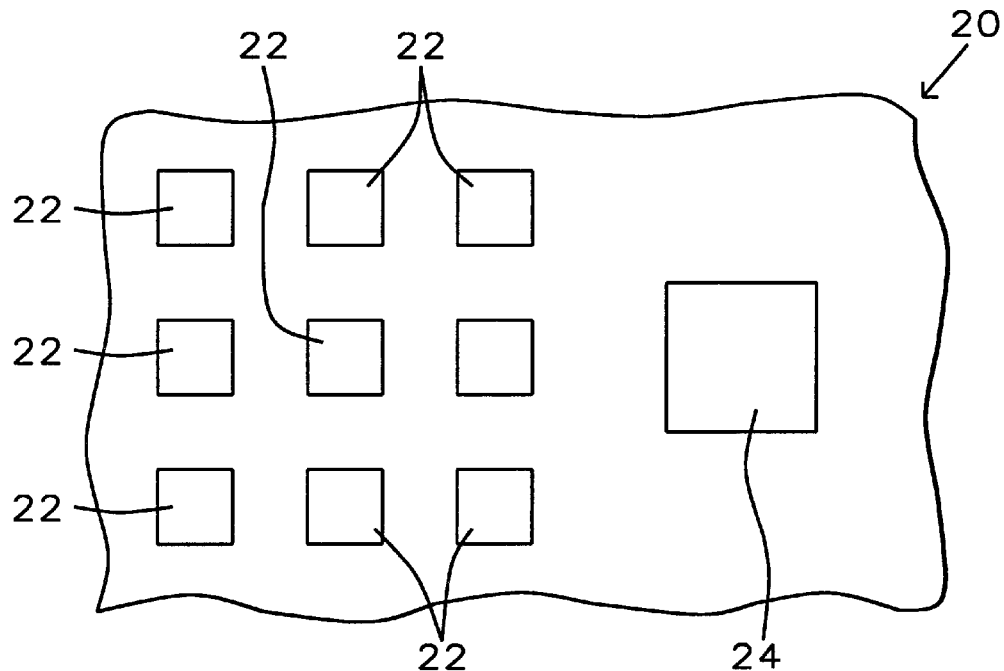
FIG. 3 shows a part of an integrated circuit wafer having an array of closely spaced contact holes and isolated larger contact holes.
Figure 4:
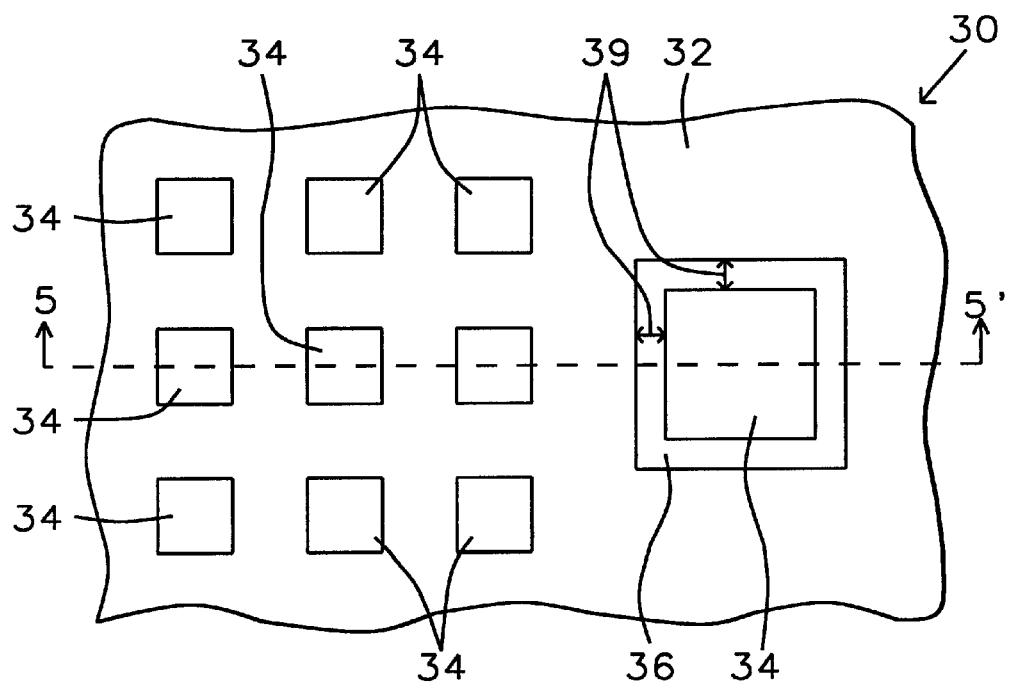
FIG. 4 shows a top view of the mask of this 10 invention used to form an array of closely spaced contact holes and isolated larger contact holes.
Figure 5:
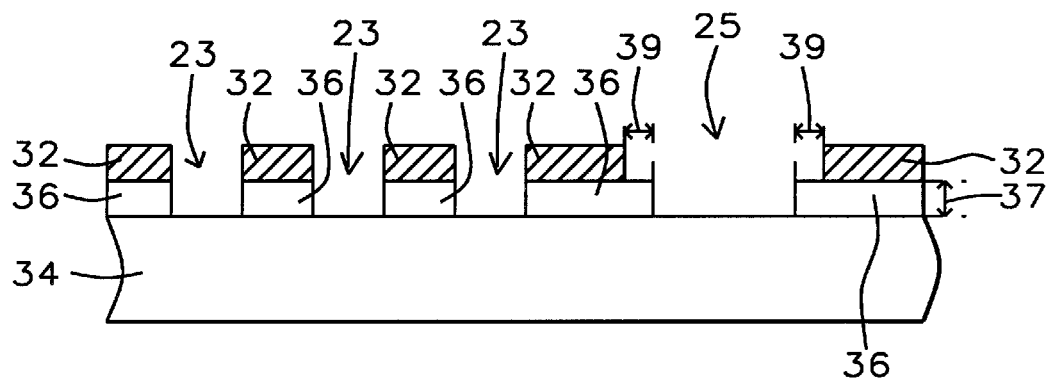
FIG. 5 shows a cross section view of the mask of FIG. 4 along the line 5–5' of FIG. 4.

Refer now to FIGS. 3–5 for a description of the mask of this invention. FIG. 3 shows a part of an integrated circuit wafer 20 having an array of closely spaced contact holes 22 and one or more isolated larger holes 24. The closely spaced holes 22 in this example are squares with sides having a length of between about 0.18 and 0.25 micrometers. The distance between the periphery of adjacent contact holes is between about 0.18 and 0.25 micrometers. The isolated larger contact holes 24 are squares with larger distances between the periphery of the larger contact holes and adjacent larger or smaller contact holes.

FIG. 4 shows a top view of the mask 30 of this invention used to form the array of closely spaced contact holes 22 and one or more isolated larger holes 24 shown in FIG. 3. FIG. 5 shows a cross section of the mask 30 of FIG. 4 taken along line 5–5' of FIG. 5. The mask is formed on a transparent mask substrate 34, such as quartz having a thickness of about $6.35 \times 10^7$ Angstroms. A patterned layer of attenuating phase shifting material 36 is formed on the transparent mask substrate 34 having holes formed for the array of closely spaced contact holes 22 and for the isolated larger holes 24. In this example the attenuating phase shifting material 36 is MoSiON. The thickness 37 of the patterned layer of attenuating phase shifting material 36 is adjusted to provide a 180° phase shift, or multiple thereof, and a transmission of between about 5% and 10%, for light having a wavelength of that which will be used to illuminate the mask and expose a layer of photoresist. In this example the thickness 37 of the MoSiON is between about 800 and 1200 Angstroms and is chosen to provide a 180° phase shift, or multiple thereof, and a transmission of between about 4% and 6% for deep ultraviolet light having a wavelength of between about 193 and 248 nanometers.

Referring again to FIGS. 4 and 5, a patterned layer of opaque material 32 is formed on the patterned layer of attenuating phase shifting material 36. In this example the opaque material is chrome having a thickness of between about 700 and 1000 Angstroms. Holes 23 are formed in the patterned layer of opaque material 32 for the array of closely spaced contact holes which have the same shape, size and location as the holes formed for the array of closely spaced contact holes in the patterned layer of attenuating phase shifting material 36, thereby forming a binary mask for the formation of the closely spaced contact holes. Holes 25 are also formed in the patterned layer of opaque material 32 for the isolated larger holes which have the same shape and location as the holes 25 formed for the isolated larger holes in the patterned layer of attenuating phase shifting material 36 but are larger than the holes formed for the isolated larger holes in the patterned layer of attenuating phase shifting material 36, thereby forming a ring type attenuating phase shifting mask for the formation of the isolated larger holes.

As can be seen in FIGS. 4 and 5, the holes 25 formed in the patterned layer of opaque material 32 leave a gap width 39 of attenuating phase shifting material 36 around the periphery of the larger isolated holes 25. This gap width 39 of attenuating phase shifting material forms a ring type attenuating phase shifting mask for the formation of the isolated larger holes. In this example the gap width 39 is between about 0.1 and 0.2 micrometers.

The mask shown in FIGS. 4 and 5 provides a binary mask section for the formation of the closely spaced array of contact holes where the depth of focus is not a problem thereby avoiding problems due to side lobe effect. The mask shown in FIGS. 4 and 5 also provides a ring type attenuating phase shifting mask for the formation of isolated larger holes where improved depth of focus is required, thereby also avoiding the problems due to side lobe effect in this region.

Figure 6:
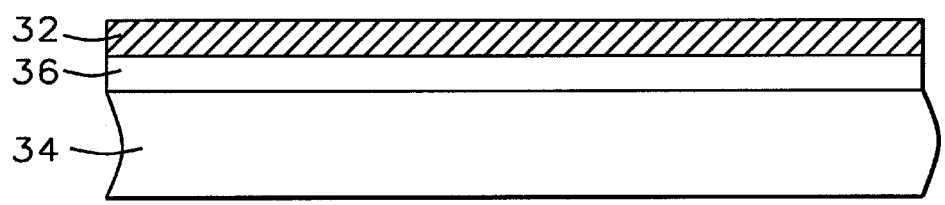
FIG. 6 shows a cross section of a transparent mask 15 substrate having a layer of attenuating phase shifting material and a layer of opaque material formed thereon.

Refer now to FIGS. 3–8 for the preferred embodiment of the method of forming the combination binary and ring type attenuating phase shifting mask of this invention. FIG. 6 shows a mask blank of a transparent mask substrate 34 having a layer of attenuating phase shifting material 36 formed on the transparent mask substrate 34 and a layer of opaque material 32 formed on the layer of attenuating phase shifting material 36. In this example the layer of attenuating phase shifting material 36 is a layer of MoSiON having a thickness of between about 800 and 1200 Angstroms and the layer of opaque material 32 is a layer of chrome having a thickens of between about 700 and 1000 Angstroms.

Figure 7:
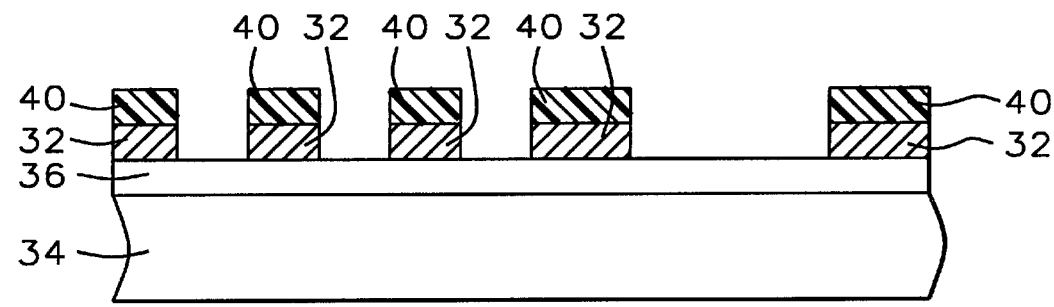
FIG. 7 shows a cross section view of a transparent mask substrate having a layer of attenuating phase shifting material and a layer of opaque material formed thereon after holes have been formed in the layer of opaque material.

As shown in FIG. 7, a first layer of resist 40 is then formed on the layer of opaque material and patterned using well known methods such as selective exposure to an electron beam or light followed by developing the resist. Holes are then etched in the layer of opaque material 32 using dry anisotropic etching and the patterned first layer of resist 40 as a mask, thereby forming holes for forming the array of closely spaced contact holes 22 and the larger isolated holes 24 on the integrated circuit wafer, see FIG. 3, in the layer of opaque material 32.

Figure 8:
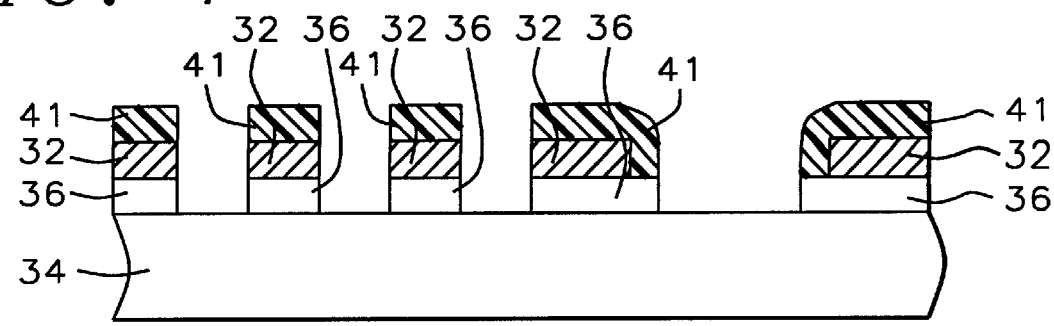
FIG. 8 shows a cross section view of a transparent mask substrate having a layer of attenuating phase shifting material and a layer of opaque material formed thereon after holes have been formed in the layer of opaque material and the layer of attenuating phase shifting material.

As shown in FIG. 8, the first layer of resist is stripped and a second layer of resist 41 is formed on the patterned layer of opaque material 32 and patterned using well known methods such as selective exposure to an electron beam or light followed by developing the second resist 41. Holes are then etched in the layer of attenuating phase shifting material 36 using dry anisotropic etching and the patterned second layer of resist 41 as a mask, thereby forming holes for forming the array of closely spaced contact holes 22 and the larger isolated holes 24 on the integrated circuit wafer, see FIG. 3, in the layer of attenuating phase shifting material 36. As shown in FIGS. 4 and 5, the patterned layer of second resist is then striped and the mask is completed.

As shown in FIGS. 4 and 5, the holes 23 formed in the patterned layer of opaque material 32 for the array of closely spaced contact holes which the same shape, size and location as the holes formed for the array of closely spaced contact holes in the patterned layer of attenuating phase shifting material 36, thereby forming a binary mask for the formation of the closely spaced contact holes. The holes 25 formed in the patterned layer of opaque material 32 for the isolated larger holes have the same shape and location as the holes 25 formed for the isolated larger holes in the patterned layer of attenuating phase shifting material 36 but are larger than the holes formed for the isolated larger holes in the patterned layer of attenuating phase shifting material 36, thereby forming a ring type attenuating phase shifting mask for the formation of the isolated larger holes. As can be seen in FIGS. 4 and 5, the holes 25 formed in the patterned layer of opaque material 32 leave a gap width 39 of attenuating phase shifting material 36 around the periphery of the larger isolated holes 25. This gap width 39 of attenuating phase shifting material forms a ring type attenuating phase shifting mask for the formation of the isolated larger holes. In this example the gap width 39 is between about 0.1 and 0.2 micrometers.

As in the previous embodiment, the mask shown in FIGS. 4 and 5 provides a binary mask section for the formation of the closely spaced array of contact holes where the depth of focus is not a problem, thereby avoiding problems due to side lobe effect. The mask shown in FIGS. 4 and 5 also provides a ring type attenuating phase shifting mask for the formation of isolated larger holes where improved depth of focus is required, thereby also avoiding the problems due to side lobe effect in this region.

While the invention has been particularly shown and described with reference to the preferred embodiments thereof, it will be understood by those skilled in the art that various changes in form and details may be made without departing from the spirit and scope of the invention.

What is claimed is:

1. A contact hole mask, comprising:
   a transparent mask substrate having a first region and a second region;
   a patterned layer of attenuating phase shifting material formed on said transparent mask substrate, wherein said patterned layer of attenuating phase shifting material has first holes and second holes formed therein, said first holes are over said first region of said transparent mask substrate, and said second holes are over said second region of said transparent mask substrate; and
   a patterned layer of opaque material formed on said patterned layer of attenuating phase shifting material, wherein said patterned layer of opaque material has first holes and second holes formed therein, said first holes in said patterned layer of opaque material have the same size and shape as said first holes in said layer of attenuating phase shifting material, said first holes in said opaque material are directly over said first holes in said attenuating phase shifting material, said second holes in said opaque material are directly over said second holes in said attenuating phase shifting material, and said second holes in said opaque material are larger than said second holes in said attenuating phase shifting material thereby exposing a gap width of said attenuating phase shifting material around the periphery of said second holes in said layer of attenuating phase shifting material.

2. The contact hole mask of claim 1 wherein said first holes in said attenuating phase shifting material and said opaque material are in an N by M array wherein N and M are positive integers.

3. The contact hole mask of claim 1 wherein said transparent mask substrate is a quartz substrate.

4. The contact hole mask of claim 1 wherein said attenuating phase shifting material is MoSiON.

5. The contact hole mask of claim 1 wherein said opaque material is chrome.

6. The contact hole mask of claim 1 wherein said attenuating phase shifting material provides a 180° phase shift for light having a wavelength of between about 193 and 248 nanometers.

7. The contact hole mask of claim 1 wherein said attenuating phase shifting material transmits between about 4% and 6% of the incident light intensity for light having a wavelength of between about 193 and 248 nanometers.

8. The contact hole mask of claim 1 wherein said first holes in said attenuating phase shifting material and said opaque material are used to form contact holes in an integrated circuit wafer wherein said contact holes are squares with sides having a length of between about 0.18 and 0.25 micrometers.

9. The contact hole mask of claim 1 wherein said first holes in said attenuating phase shifting material and said opaque material are used to form contact holes in an integrated circuit wafer wherein the distance between the periphery of adjacent said contact holes is between about 0.18 and 0.25 micrometers.

10. A method of forming a contact hole mask, comprising the steps of:
    providing a transparent mask substrate having a first region and a second region;
    forming a layer of attenuating phase shifting material on said transparent mask substrate;
    forming a layer of opaque material on said layer of attenuating phase shifting material;
    forming a first number of first holes and a second number of second holes in said layer of opaque material, wherein said first holes in said layer of opaque material are directly over said first region of said transparent mask substrate and said second holes in said layer of opaque material are directly over said second region of said transparent mask substrate;
    forming said first number of first holes and said second number of second holes in said layer of attenuating phase shifting material, wherein said first holes in said layer of opaque material have the same size and shape and are directly over said first holes in said layer of attenuating phase shifting material, said second holes in said layer of opaque material are directly over said second holes in said layer of attenuating phase shifting material, and said second holes in said layer of opaque material are larger than said second holes in said layer of attenuating phase shifting material thereby exposing a gap width of said attenuating phase shifting material around the periphery of said second holes in said layer of attenuating phase shifting material.

11. The method of claim 10 wherein said first holes in said layer of attenuating phase shifting material and said layer of opaque material are in an N by M array wherein N and M are positive integers.

12. The method of claim 10 wherein said transparent mask substrate is a quartz substrate.

13. The method of claim 10 wherein said attenuating phase shifting material is MoSiON.

14. The method of claim 10 wherein said opaque material is chrome.

15. The method of claim 10 wherein said layer of attenuating phase shifting material provides a 180° phase shift for light having a wavelength of between about 193 and 248 nanometers.

16. The method of claim 10 wherein said layer of attenuating phase shifting material transmits between about 4% and 6% of the incident light intensity for light having a wavelength of between about 193 and 248 nanometers.

17. The method of claim 10 wherein said first holes in said layer of attenuating phase shifting material and said layer of opaque material are used to form contact holes in an integrated circuit wafer wherein said contact holes are squares with sides having a length of between about 0.18 and 0.25 micrometers.

18. The method of claim 10 wherein said first holes in said layer of attenuating phase shifting material and said layer of opaque material are used to form contact holes in an integrated circuit wafer wherein the distance between the periphery of adjacent said contact holes is between about 0.18 and 0.25 micrometers.

* * * * *